United States Patent
Takano et al.

(10) Patent No.: US 8,319,942 B2
(45) Date of Patent: Nov. 27, 2012

(54) EXPOSURE APPARATUS AND DEVICE FABRICATION METHOD

(75) Inventors: Shin Takano, Utsunomiya (JP); Hideki Matsumoto, Utsunomiya (JP); Yoshihiro Omameuda, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 582 days.

(21) Appl. No.: 12/553,703

(22) Filed: Sep. 3, 2009

(65) Prior Publication Data

US 2010/0060872 A1 Mar. 11, 2010

(30) Foreign Application Priority Data

Sep. 5, 2008 (JP) ................. 2008-229066
Jun. 16, 2009 (JP) ................. 2009-143669

(51) Int. Cl.
*G03B 27/42* (2006.01)
*G03B 27/58* (2006.01)

(52) U.S. Cl. .......................... 355/53; 355/72
(58) Field of Classification Search .................. 355/53, 355/72, 75
See application file for complete search history.

(56) References Cited

U.S. PATENT DOCUMENTS 7,068,350 B2 6/2006 Nishi et al.

FOREIGN PATENT DOCUMENTS

JP 2003059806 A * 2/2003
JP 2004-072076 3/2004

OTHER PUBLICATIONS

Machine translation of JP 2003059806 A, Feb. 2003.*

* cited by examiner

*Primary Examiner* — Peter B Kim
(74) *Attorney, Agent, or Firm* — Canon USA Inc. IP Division

(57) ABSTRACT

The present invention provides an apparatus including a calculating unit which calculates a first time serving as a time required to drive a stage in a non-scanning direction perpendicular to a scanning direction, and a second time serving as a time required to drive the stage in the scanning direction, both of which range from when exposure of one of the plurality of shot regions ends until exposure of the next shot region starts, and an adjusting unit which adjusts, when the first time is longer than the second time, one of a time for which an acceleration of the stage nonlinearly changes in the process of reversing the scanning direction, and a settling time taken for the stage to settle from when acceleration of the stage ends until exposure starts, so that the second time becomes longer than the first time in driving the stage in the scanning direction.

7 Claims, 11 Drawing Sheets

EXPOSURE APPARATUS AND DEVICE FABRICATION METHOD

BACKGROUND OF THE INVENTION

1. Field of the Invention

The present invention relates to an exposure apparatus and a device fabrication method. More specifically, suppressing a decrease in throughput by controlling stage driving.

2. Description of the Related Art

A projection exposure apparatus has conventionally been employed to fabricate a micropatterned semiconductor device such as a semiconductor memory or logic circuit by using photolithography. The projection exposure apparatus projects and transfers, by a projection optical system, a pattern (circuit pattern) formed on a reticle (mask) onto a substrate (e.g., a wafer) coated with a photosensitive agent such as a resist.

An exposure apparatus of the step & scan scheme (called a "scanner") has become the current mainstream in place of an exposure apparatus of the step & repeat scheme (called a "stepper"). The step & scan scheme means an exposure scheme of transferring the pattern of a reticle to a given shot region on a wafer while scanning the reticle and the wafer, and moving the wafer step by step to move the exposure target position to the next shot region after the end of exposure of the given shot region.

A resist generally has an exposure amount (to be referred to as a "set exposure amount" hereinafter) D (J/m²) specified to transfer (form) the pattern of a reticle onto the resist with high accuracy. For this reason, a scanning velocity V (mm/sec) of a wafer (a stage which holds the wafer) in a scanner needs to satisfy:

$$V \leq I\text{max}/D \times Ws \quad (1)$$

where Imax (W/m²) is the maximum illuminance of the exposure light on the wafer, and Ws (mm) is the exposure slit width in the non-scanning direction on the wafer.

Referring to relation (1), a maximum scanning velocity Vd determined from the set exposure amount D is given by:

$$Vd = I\text{max}/D \times Ws \quad (2)$$

Moreover, since a scanner has a maximum scanning velocity Vmax which is virtually determined based on a stage control system, including specifications associated with its structural and mechanical performances, the scanning velocity V needs to satisfy:

$$V \leq V\text{max} \quad (3)$$

A scanner synchronously controls a reticle and a wafer so that they hold a predetermined positional relationship, and transfers (forms) the pattern of the reticle onto the wafer by scanning the reticle and the wafer. However, when the reticle and the wafer suffer a deviation (to be referred to as a "synchronization error" hereinafter) from the predetermined positional relationship, this leads to a decrease in resolution and a misalignment in imaging position of the pattern and, in turn, disturbs the manufacture of semiconductor devices. The synchronization error is nearly proportional to the scanning velocity; the synchronization error increases as the scanning velocity rises. Accordingly, the maximum scanning velocity Vmax is determined to keep the synchronization error within a tolerance.

It is also necessary to expose the wafer with a plurality of pulsed light beams including pulses the number of which is equal to or larger than a predetermined pulse count (to be referred to as a "minimum pulse count" hereinafter) P when pulsed light such as a KrF excimer laser beam or an ArF excimer laser beam is used as the exposure light. Meeting this requirement makes it possible to uniform the integrated exposure amount while suppressing the influence of a variation in energy per pulse of the pulsed light. Hence, the minimum pulse count Pmin needs to satisfy:

$$P\text{min} \leq Ws/V \times f \quad (4)$$

where f (Hz) is the oscillation frequency of the exposure light (pulsed light).

Referring to relation (4), a maximum scanning velocity Vp determined from the minimum pulse count Pmin is given by:

$$Vp = Ws/P\text{min} \times f\text{max} \quad (5)$$

where fmax is the maximum oscillation frequency of the exposure light.

Under the circumstances, the oscillation frequency of the exposure light is determined to be the maximum oscillation frequency fmax for a resist having a relatively large set exposure amount D, and the scanning velocity is determined to be the maximum scanning velocity Vmax for a resist having a relatively small set exposure amount D, so as to satisfy relations (1), (3), and (4) in both cases.

For example, a case in which the integrated exposure amount can be equal to the minimum pulse count Pmin regardless of the maximum scanning velocity Vd (equation (2)) determined from the set exposure amount D, the maximum scanning velocity Vmax determined from the stage control system, and the set exposure amount D will be considered. In this case, the minimum value of the maximum scanning velocity Vp (equation (5)) determined from the minimum pulse count Pmin is determined as the scanning velocity during actual exposure.

To improve the throughput, a scanner typically sequentially transfers the pattern of a reticle to a plurality of shot regions on a wafer by alternate scanning (reciprocating scanning) of the reticle. This requires an operation (over-scanning) for further moving the reticle by the same distance as the moving distance upon pre-scanning before the start of exposure of the next shot region after the end of exposure of one shot region, thereby returning the reticle to the scanning start position to expose the next shot region. Also, an operation for moving the wafer in the scanning direction is needed, in addition to an operation for moving the wafer to the next shot region (another shot region adjacent to one region in the non-scanning direction) step by step. Note that the moving distance upon pre-scanning means the moving distance in the acceleration time for which the stage accelerates until its velocity reaches a target velocity (the scanning velocity during exposure), and in the settling time taken for the stage to settle from when its acceleration ends until its velocity reaches a target velocity (falls within a tolerance) (i.e., until stage vibration dies down).

More specifically, the procedure of an operation for moving the wafer between shot regions is as follows:

(1) the wafer (the stage which holds the wafer) is moved to the same coordinate position in the scanning direction as the scanning start position of the next shot region after the end of exposure of one shot region;

(2) the wafer (the stage which holds the wafer) is moved to the scanning start position of the next shot region step by step in the non-scanning direction; and (3) scanning of the wafer (the stage which holds the wafer) is started in order to expose the next shot region.

In this manner, the wafer moves along a roughly U-shaped route. During this time, that is, during the time from when exposure of one shot region ends until exposure of the next shot region starts (until stage deceleration in the scanning direction starts), setting information such as control parameters necessary to expose the next shot region is sent to the stage control system. This allows stage control (stage driving) so as to prevent the stage from stopping during the time from when exposure of one shot region ends until the settling time taken for exposure of the next shot region to be ready comes, thus improving the throughput. However, to attain stage control so as to prevent the stage from stopping during that time, movement of the wafer (the stage which holds the wafer) in the non-scanning direction needs to be completed before the completion of wafer movement in the scanning direction. Japanese Patent Laid-Open No. 2004-072076 discloses details of this technique.

Unfortunately, depending on the conditions such as the scanning velocity and the moving distance (stepping distance) of the wafer (the stage which holds the wafer) in the non-scanning direction, wafer movement in the non-scanning direction often cannot be completed before the completion of wafer movement in the scanning direction. In such a case, it is impossible to attain stage control so as to prevent the stage from stopping during the foregoing time. This leads to an unsatisfactory improvement in throughput and even causes a decrease in throughput.

SUMMARY OF THE INVENTION

An embodiment of the present invention provides an exposure apparatus which can suppress a decrease in throughput by controlling stage driving in accordance with, for example, the stage driving condition and shot information concerning the arrangement of shot regions.

According to one aspect of the present invention, there is provided a scanning exposure apparatus which sequentially transfers a pattern of a reticle to a plurality of shot regions on a substrate while synchronously moving the reticle and the substrate in a scanning direction and reversing the scanning direction, the apparatus including an obtaining unit configured to obtain a driving condition of a stage which holds the substrate, and shot information concerning an arrangement of the plurality of shot regions, a calculating unit configured to calculate, based on the driving condition and shot information obtained by the obtaining unit, a first time serving as a time required to drive the stage in a non-scanning direction perpendicular to the scanning direction, and a second time serving as a time required to drive the stage in the scanning direction, both of which range from when exposure of one of the plurality of shot regions ends until exposure of the next shot region starts, and an adjusting unit configured to adjust, when the first time calculated by the calculating unit is longer than the second time calculated by the calculating unit, one of a time for which an acceleration of the stage nonlinearly changes in the process of reversing the scanning direction, and a settling time taken for the stage to settle from when acceleration of the stage ends until exposure starts, so that the second time becomes longer than the first time in driving the stage in the scanning direction.

Further features of the present invention will become apparent from the following description of exemplary embodiments with reference to the attached drawings.

DESCRIPTION OF THE EMBODIMENTS

Figure 1:
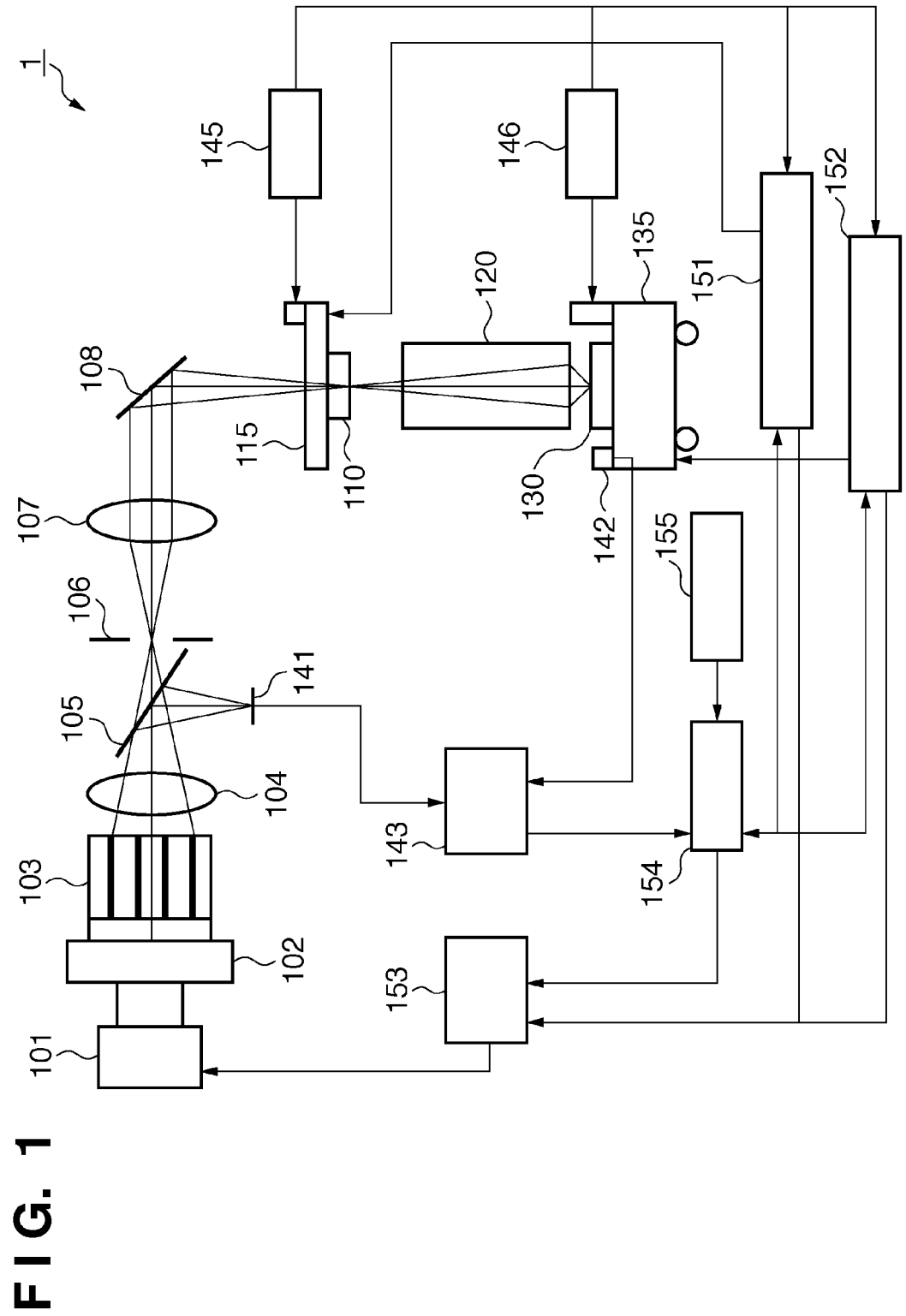
FIG. 1 is a schematic view showing an exposure apparatus according to one aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing an exposure apparatus 1 according to one aspect of the present invention. The exposure apparatus 1 is a projection exposure apparatus of the so-called step & scan scheme (scanning type), which sequentially transfers the pattern of a reticle 110 to a plurality of shots on a wafer 130 while synchronously moving the reticle 110 and the wafer 130 in the scanning direction and reversing the scanning direction.

The exposure apparatus 1 includes a light source 101 such as an excimer laser which emits pulsed light, a beam shaping optical system 102, an optical integrator 103, a condenser lens 104, a half mirror 105, and a movable slit 106. The exposure apparatus 1 also includes an imaging lens 107, a mirror 108, a reticle stage 115 which holds the reticle 110, a projection optical system 120, and a wafer stage 135 which holds the wafer 130. The exposure apparatus 1 also includes a first detecting unit 141, second detecting unit 142, exposure amount calculating unit 143, reticle stage control unit 151, wafer stage control unit 152, light source control unit 153, main control unit 154, and storage unit 155. Note that an optical system from the light source 101 to the reticle 110 (the beam shaping optical system 102 to the mirror 108) is commonly called an illumination optical system, and constitutes an illumination apparatus together with the light source 101.

A light beam emitted by the light source 101 is shaped into a predetermined shape by the beam shaping optical system 102, and enters the optical integrator 103. Note that the light source control unit 153 controls the light source 101. More specifically, the light source control unit 153 outputs a trigger signal and a charging voltage signal in accordance with a desired set exposure amount to control, for example, the output energy and oscillation frequency of the light source 101. The light source control unit 153 also controls (adjusts) the amount of light beam from the light source 101 via a light attenuation mechanism (not shown).

The optical integrator 103 includes, for example, a fly-eye lens including a plurality of microlenses, and forms a secondary light source near its exit surface.

The light beam from the secondary light source formed near the exit surface of the optical integrator 103 illuminates the movable slit 106 via the condenser lens 104. The half mirror 105 is interposed between the optical integrator 103 and the movable slit 106.

The light beam having passed through the movable slit 106 illuminates the reticle 110 (more specifically, a part of the pattern formed on the reticle 110), held by the reticle stage 115, via the imaging lens 107 and the mirror 108.

The light beam having passed through the reticle 110 is reduced and projected onto the wafer 130, coated with a resist (photosensitive agent), via the projection optical system 120. The wafer 130 serving as a substrate onto which the pattern of the reticle 110 is transferred (projected) is held by the wafer stage 135 which can be driven in the X, Y, Z, and tilt directions.

The first detecting unit 141 detects the amount of some components of the light beam (illumination light beam) split by the half mirror 105, and outputs the detected light amount to the exposure amount calculating unit 143. Also, the second detecting unit 142 is located on the wafer stage 135, detects the amount of light beam having passed through the projection optical system 120, and outputs the detected light amount to the exposure amount calculating unit 143. The exposure amount calculating unit 143 calculates the exposure amount based on the light amounts output from the first detecting unit 141 and/or the second detecting unit 142.

In exposure amount control, first, the correlation between the exposure amounts calculated from the light amounts detected by the first detecting unit 141 and the second detecting unit 142 is obtained before an exposure process. Since the second detecting unit 142 cannot detect the light amount during an exposure process, the exposure amount on the wafer 130 is controlled based on the above-mentioned correlation and the light amount detected by the first detecting unit 141.

The positions of the reticle stage 115 and wafer stage 135 are respectively detected by interferometers 145 and 146 and output to the reticle stage control unit 151 and wafer stage control unit 152. Under the control of the main control unit 154, the reticle stage control unit 151 and wafer stage control unit 152 control driving of the reticle stage 115 and wafer stage 135 based on the positions of the reticle stage 115 and wafer stage 135. More specifically, the reticle stage control unit 151 and wafer stage control unit 152 control driving of the reticle stage 115 and wafer stage 135 so that they are scanned in opposite directions at constant velocities having a ratio that equals the magnification of the projection optical system 120. In this way, the pattern of the reticle 110 is transferred to one shot region on the wafer. Note that movement between a plurality of shot regions on the wafer (i.e., movement between adjacent shot regions) is performed by driving the wafer stage 135.

When the exposure process (i.e., the transfer of the pattern of the reticle 110) is complete for all of the plurality of shot regions on the wafer, the wafer 130 is transported outside the apparatus from the wafer stage 135 through a wafer recovery transport system (not shown). Also, a new wafer 130 is supplied to the apparatus (the wafer stage 135) through a wafer supply transport system (not shown), and aligned by an alignment system (not shown).

The wafer 130 is aligned by detecting the positions of alignment marks located around the plurality of selected shot regions, calculating, for example, offsets of the rotation, expansion/contraction, and shift of the wafer 130, and positioning all the shot regions. In addition, the wafer 130 often undergoes coarse alignment for detecting the positions of the alignment marks before fine alignment of the wafer 130. After each shot region is positioned in this way, the above-mentioned exposure process is repeated.

The main control unit 154 includes, for example, a CPU and a memory and controls the whole (operation) of the exposure apparatus 1. In this embodiment, the main control unit 154 controls an operation (process) for step-by-step movement from one of a plurality of shot regions to the next shot region so as to optimize the throughput.

The storage unit 155 stores the driving conditions of the reticle stage 115 and wafer stage 135 and shot information concerning the arrangement of a plurality of shot regions in advance through an input unit (not shown). The driving condition mentioned herein includes at least one of the velocities, accelerations, and jerks of the reticle stage 115 and wafer stage 135. Note that jerk is the time derivative of acceleration. Also, the shot information mentioned herein includes the distance between adjacent shot regions of a plurality of shot regions on the wafer, and the lengths (scanning lengths) of a plurality of shot regions in the longitudinal direction.

An operation (process) for step-by-step movement from one of a plurality of shot regions to the next shot region will be explained below, together with the function of the main control unit 154, in the first and second embodiments.

In the first embodiment, a main control unit 154 obtains the driving conditions of a reticle stage 115 and wafer stage 135, and shot information concerning the arrangement of a plurality of shot regions from a storage unit 155 (functions as an obtaining unit).

Based on the obtained driving conditions and shot information, the main control unit 154 calculates a first time serving as the time required to drive the wafer stage 135 in the non-scanning direction perpendicular to the scanning direction from when exposure of one shot region ends until exposure of the next shot region starts. The main control unit 154 also calculates a second time serving as the time required to drive the wafer stage 135 in the scanning direction from when exposure of one shot region ends until exposure of the next shot region starts (functions as a calculating unit). Note that in the first embodiment, the second time includes the settling time taken for vibration of the wafer stage 135 to fall within a tolerance.

If the calculated first time is longer than the calculated second time, the main control unit 154 selects a first mode or a second mode different from the first mode as the mode of driving the wafer stage 135 (functions as a selecting unit). The first mode means a mode of driving the wafer stage 135 in the scanning direction by adjusting the time, for which the acceleration of the wafer stage 135 changes in the process of reversing the scanning direction, so that the second time becomes longer than the first time. On the other hand, the second mode means a mode of driving the wafer stage 135 in the scanning direction by adjusting the settling time, taken for the wafer stage 135 to settle after its driving, so that the second time becomes longer than the first time. If the calculated first time is shorter than the calculated second time, the main control unit 154 selects a third mode different from the first mode and second mode. The third mode means a mode of driving the wafer stage 135 without adjusting the time for which the acceleration of the wafer stage 135 changes in the process of reversing the scanning direction, and the settling time taken for the wafer stage 135 to settle after its driving.

The main control unit 154 checks whether the time required to drive the wafer stage 135 in the first mode is longer than that required to drive the wafer stage 135 in the second mode (functions as a determining unit). If the main control unit 154 determines that the time required to drive the wafer stage 135 in the first mode is longer than that required to drive the wafer stage 135 in the second mode, it selects the second mode. On the other hand, if the main control unit 154 determines that the time required to drive the wafer stage 135 in the first mode is not longer than that required to drive the wafer stage 135, it selects the first mode.

Control of an operation (process) for step-by-step movement from one shot region to the next shot region by the main control unit 154 in the first embodiment will be explained in detail.

Figures 2A, 2B:
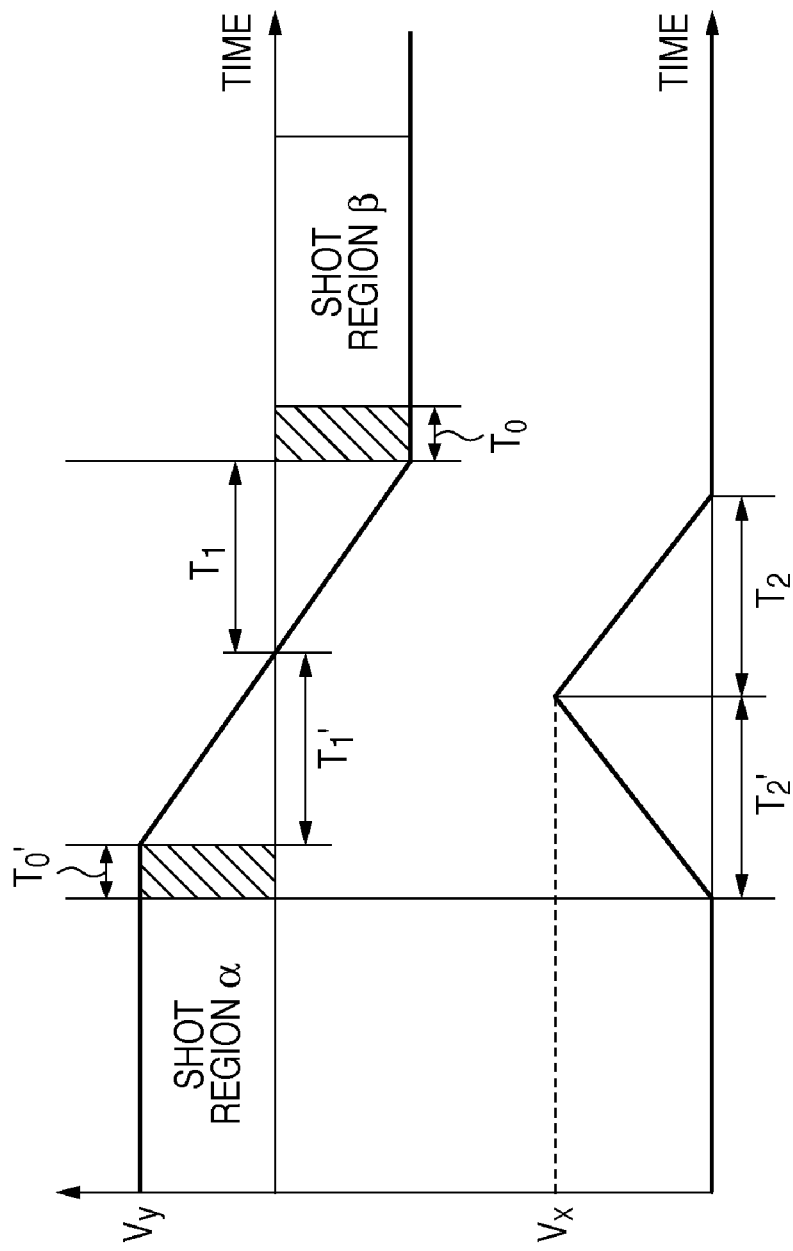
FIGS. 2A and 2B are graphs illustrating an example of a velocity control map of a wafer stage in step-by-step movement between two shot regions adjacent in the X direction in the first embodiment.

FIGS. 2A and 2B are graphs illustrating an example of a velocity control map of the wafer stage 135 in step-by-step movement between two shot regions (shot regions α and β) adjacent in the X direction. FIG. 2A represents a velocity (scanning velocity) $V_y$ of the wafer stage 135 in the scanning direction (Y direction), and FIG. 2B represents a velocity (scanning velocity) $V_x$ of the wafer stage 135 in the non-scanning direction (X direction). In both FIGS. 2A and 2B, the abscissa indicates time.

Referring to FIG. 2A, the total time to drive the wafer stage 135 in the scanning direction can be segmented into four times:

(a) a subsequent settling time $T_0'$ equal to the settling time taken for the wafer stage 135 to settle, from when its acceleration ends until exposure of the shot region β starts, while keeping the velocity of the wafer stage 135 after the end of exposure of the shot region α;

(b) a deceleration time $T_1'$ for which the wafer stage 135 decelerates in the scanning direction;

(c) an acceleration time $T_1$ for which the wafer stage 135 accelerates until the velocity reaches a target velocity (target scanning velocity) without stopping; and (d) a settling time $T_0$ taken for the wafer stage 135 to settle after the end of its acceleration.

Also, referring to FIG. 2B, the total time to drive the wafer stage 135 in the non-scanning direction can be segmented into two times:

(e) an acceleration time $T_2'$ for which the wafer stage 135 accelerates in the non-scanning direction in order for movement to the next shot region β after the end of exposure of the shot region α; and (f) a deceleration time $T_2$ for which the wafer stage 135 decelerates in the non-scanning direction.

Driving of the wafer stage 135 in the non-scanning direction need only be completed before the completion of driving of the wafer stage 135 in the scanning direction for movement to the next shot region β after the end of exposure of the shot region α (before a settling time $T_0$). In other words, the processing time corresponding to the above-mentioned times (a) to (f) need only satisfy (a)+(b)+(c)>(e)+(f).

Let $L_x$ be the moving distance of the wafer stage 135 in the non-scanning direction (i.e., the distance between shot regions), $V_x$ be the velocity of the wafer stage 135 in the non-scanning direction, and $T_2$ or $T_2'$ be the acceleration/deceleration time of the wafer stage 135 in the non-scanning direction. Also, let a be the acceleration of the wafer stage 135 in the scanning direction, $L_y$ be the moving distance of the wafer stage 135 in the scanning direction (i.e., the scanning length), $T_1$ or $T_1'$ be the acceleration/deceleration time of the wafer stage 135 in the scanning direction, and $V_y$ be the velocity of the wafer stage 135 in the scanning direction. Then, we have:

$$L_x = V_x T_2$$

$$V_x = a T_2$$

$$L_y = V_y T_1$$

$$V_y = a T_1$$

Note that for the sake of descriptive simplicity, FIGS. 2A and 2B do not show, for example, the data communication and arithmetic operation times to control driving of the wafer stage 135, and show the respective velocities and accelerations without discriminating the scanning direction of the wafer stage 135 and whether acceleration or deceleration of the wafer stage 135 is in progress. Furthermore, although a time duration (jerk time) for which the acceleration changes occurs at the time of acceleration and deceleration of the wafer stage 135 in practice, it is ignored in this description.

Assume, for example, that the moving distance $L_x$ of the wafer stage 135 in the non-scanning direction is 20 mm, the acceleration a of the wafer stage 135 is 1 G, the settling time $T_0$ (subsequent settling time $T_0'$) is 10 ms, and the velocity $V_y$ of the wafer stage 135 in the scanning direction is 450 mm/s.

In this case, $T_1 = V_y/a = 450/(1 \times 9.8) = 45.9$ ms, and $T_2 = \sqrt{L_x/a} = \sqrt{(0.02/(1 \times 9.8))} = 45.2$ ms. Also, (a)+(b)+(c)=10 ms+45.9 ms+45.9 ms=101.8 ms, and (e)+(f)=45.2 ms+45.2 ms=90.4 ms. Hence, a relation (a)+(b)+(c)>(e)+(f) holds. This means that driving of the wafer stage 135 in the non-scanning direction can be completed before the completion of driving of the wafer stage 135 in the scanning direction for movement to the next shot region (before the settling time).

Figures 3A, 3B:
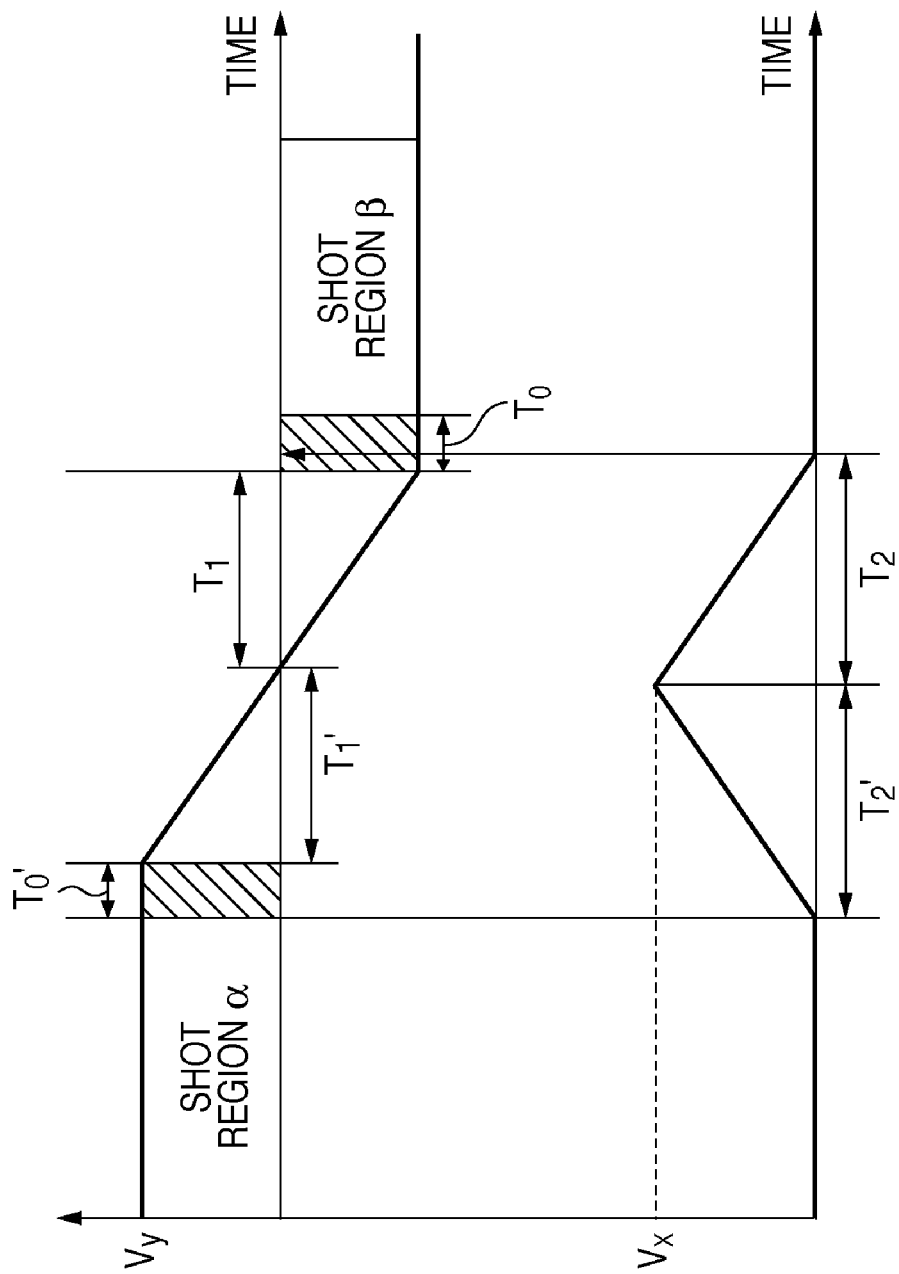
FIGS. 3A and 3B are graphs illustrating an example of a velocity control map of the wafer stage when the wafer stage moving distance (the distance between shot regions) in the non-scanning direction is increased in the first embodiment.

FIGS. 3A and 3B are graphs illustrating an example of a velocity control map of the wafer stage 135 when the moving distance of the wafer stage 135 in the non-scanning direction (the distance between shot regions) is increased. FIG. 3A represents a velocity (scanning velocity) $V_y$ of the wafer stage 135 in the scanning direction (Y direction), and FIG. 3B represents a velocity (scanning velocity) $V_x$ of the wafer stage 135 in the non-scanning direction (X direction). In both FIGS. 3A and 3B, the abscissa indicates time.

Assume, for example, that the moving distance $L_x$ of the wafer stage 135 in the non-scanning direction is 26 mm, the acceleration of the wafer stage 135 is 1 G, the settling time $T_0$ (subsequent settling time $T_0'$) is 10 ms, and the velocity $V_y$ of the wafer stage 135 in the scanning direction is 450 mm/s.

In this case, $T_1 = V_y/a = 450/(1 \times 9.8) = 45.9$ ms, and $T_2 = \sqrt{L_x/a} = \sqrt{(0.026/(1 \times 9.8))} = 51.5$ ms. Also, (a)+(b)+(c)=10 ms+45.9 ms+45.9 ms=101.8 ms, and (e)+(f)=51.3 ms+51.3 ms=102.6 ms. Hence, a relation (a)+(b)+(c)>(e)+(f) does not hold. This means that driving of the wafer stage 135 in the non-scanning direction cannot be completed before the completion of driving of the wafer stage 135 in the scanning direction for movement to the next shot region (before the settling time).

In this manner, as the moving distance of the wafer stage 135 in the non-scanning direction increases (i.e., as the driving condition of the wafer stage 135 or the shot information changes), it becomes impossible to perform control so as to prevent driving of the wafer stage 135 from stopping.

To combat this problem, the time for which the acceleration of the wafer stage 135 changes in the process of reversing the scanning direction, or the settling time taken for the wafer stage 135 to settle after its driving is adjusted, as will be described with reference to FIGS. 4A and 4B and 5A and 5B hereinafter, in the first embodiment. With this operation, driving of the wafer stage 135 in the non-scanning direction can be completed before the completion of driving of the wafer stage 135 in the scanning direction for movement to the next shot region (before the settling time).

Figures 4A, 4B:
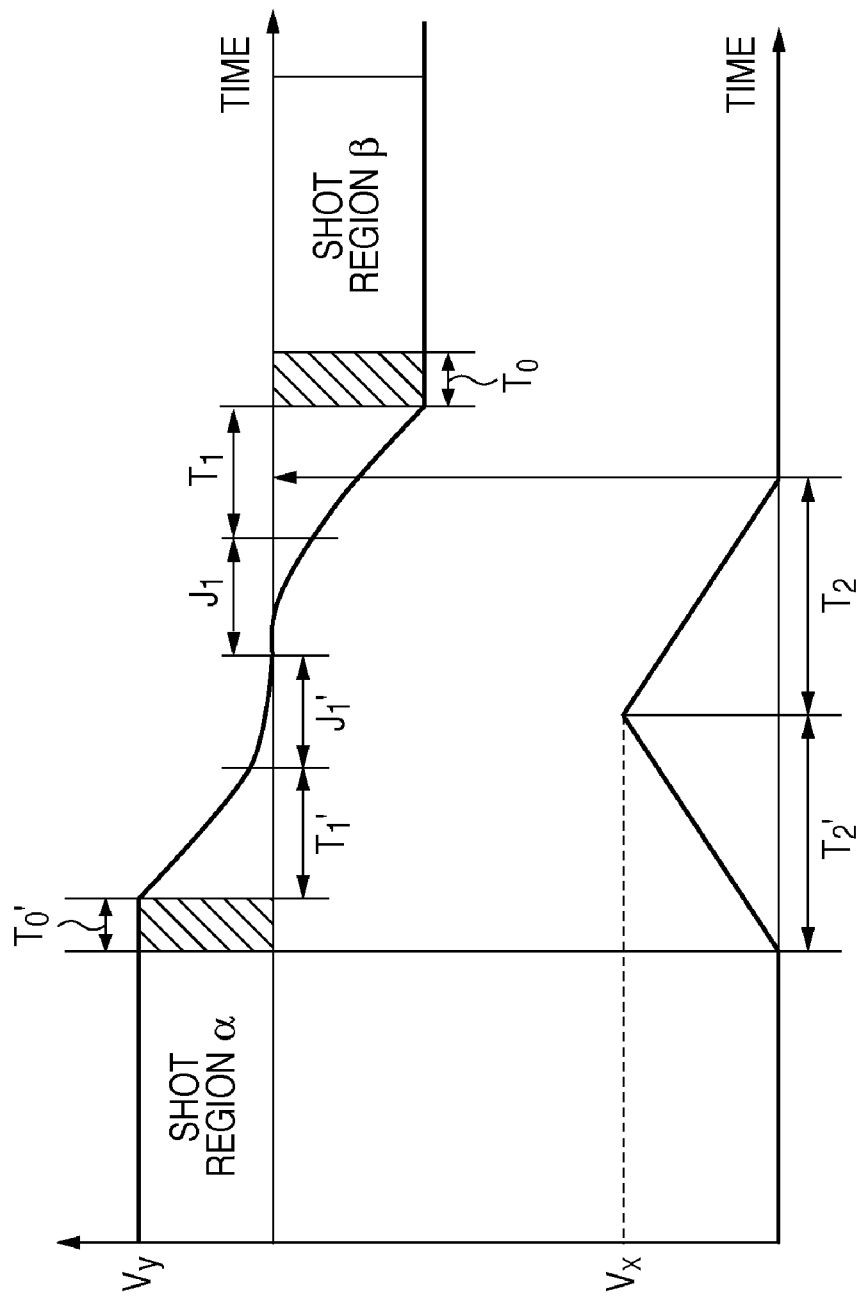
FIGS. 4A and 4B are graphs illustrating an example of a velocity control map when the time for which the acceleration of the wafer stage changes in the process of reversing the scanning direction is adjusted in the first embodiment.

FIGS. 4A and 4B are graphs illustrating an example of a velocity control map of the wafer stage 135 when the time for which the acceleration of the wafer stage 135 changes in the process of reversing the scanning direction is adjusted. FIG. 4A represents a velocity (scanning velocity) $V_y$ of the wafer stage 135 in the scanning direction (Y direction), and FIG. 4B represents a velocity (scanning velocity) $V_x$ of the wafer stage 135 in the non-scanning direction (X direction). In both FIGS. 4A and 4B, the abscissa indicates time.

Assume, for example, that the moving distance $L_x$ of the wafer stage 135 in the non-scanning direction is 26 mm, the acceleration a of the wafer stage 135 is 1 G, the settling time $T_0$ (subsequent settling time $T_0'$) is 10 ms, and the velocity $V_y$ of the wafer stage 135 in the scanning direction is 450 mm/s. Assume also that times $J_1$ and $J_1'$ for which the acceleration of the wafer stage 135 changes are 10 ms.

In this case, $T_1=V_y/a-3/8J_1=450/(1\times9.8)-3/8\times10=42.2$ ms, and $T_2=\sqrt{L_x/a}=\sqrt{(0.026/(1\times9.8))}=51.5$ ms. Also, (a)+(b)+(c)=10 ms+42.2 ms+10 ms+10 ms+42.2 ms=114.4 ms, and (e)+(f)=51.3 ms+51.3 ms=102.6 ms. Hence, a relation (a)+(b)+(c)>(e)+(f) holds. This means that driving of the wafer stage 135 in the non-scanning direction can be completed before the completion of driving of the wafer stage 135 in the scanning direction for movement to the next shot region (before the settling time).

Figures 5A, 5B:
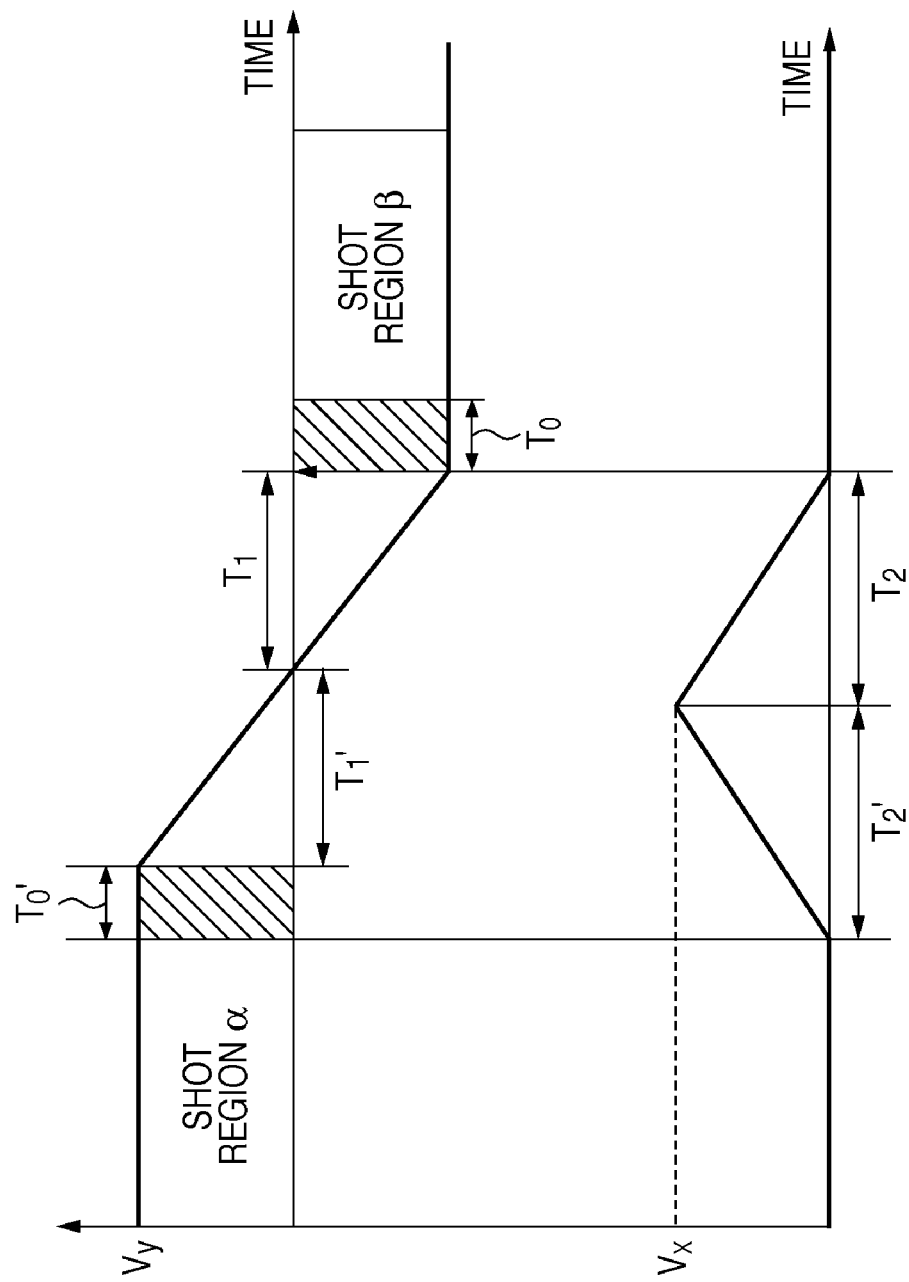
FIGS. 5A and 5B are graphs illustrating an example of a velocity control map of the wafer stage when the settling time taken for the wafer stage to settle after its driving is adjusted in the first embodiment.

FIGS. 5A and 5B are graphs illustrating an example of a velocity control map of the wafer stage 135 when the settling time taken for the wafer stage 135 to settle after its driving is adjusted. FIG. 5A represents a velocity (scanning velocity) $V_y$ of the wafer stage 135 in the scanning direction (Y direction), and FIG. 5B represents a velocity (scanning velocity) $V_x$ of the wafer stage 135 in the non-scanning direction (X direction). In both FIGS. 5A and 5B, the abscissa indicates time.

A relation (a)+(b)+(c)>(e)+(f) does not hold when the moving distance $L_x$ of the wafer stage 135 in the non-scanning direction remains 26 mm, and the settling time $T_0$ (subsequent settling time $T_0'$) remains 10 ms, as described above. However, a relation (a)+(b)+(c)>(e)+(f) holds upon changing (a)+(b)+(c)=101.8 ms to 103.1 ms by an increment of 1.3 ms.

Exploiting this fact, the settling time $T_0$ (subsequent settling time $T_0'$) is adjusted to 11.3 ms by an increment of 1.3 ms. With this operation, driving of the wafer stage 135 in the non-scanning direction can be completed before the completion of driving of the wafer stage 135 in the scanning direction for movement to the next shot region (before the settling time), as shown in FIGS. 5A and 5B.

The time ((a)+(b)+(c)+(d)) required to drive the wafer stage 135 in the driving pattern shown in FIGS. 4A and 4B (corresponding to the first mode) is compared with that required to drive the wafer stage 135 in the driving pattern shown in FIGS. 5A and 5B (corresponding to the second mode). The time ((a)+(b)+(c)+(d)) required to drive the wafer stage 135 in the driving pattern shown in FIGS. 4A and 4B (corresponding to the first mode) is 10 ms+42.2 ms+10 ms+10 ms+42.2 ms+10 ms=124.4 ms. On the other hand, the time ((a)+(b)+(c)+(d)) required to drive the wafer stage 135 in the driving pattern shown in FIGS. 5A and 5B (corresponding to the second mode) is 11.3 ms+45.9 ms+45.9 ms+11.3 ms=114.4 ms.

In view of this, the required time can be shortened by 10 ms per shot region by adjusting the settling time $T_0$ (subsequent settling time $T_0'$), thus improving the throughput. When, for example, the number of shot regions on the wafer is 110 (the number of shot regions, where the stage changes its moving direction, is 10), and 100 wafers are processed per hour (100 wph), the processing time can be shortened by $100\times10$ ms=1000 ms per wafer. This equals a throughput of $100\times0.01\times100/(3600/100)=2.8$ wph. Hence, the number of wafers processed per hour in the case of FIGS. 5A and 5B is advantageously 2.8 larger than that when the wafer stage 135 is driven in the driving pattern shown in FIGS. 4A and 4B (corresponding to the first mode).

Figure 6:
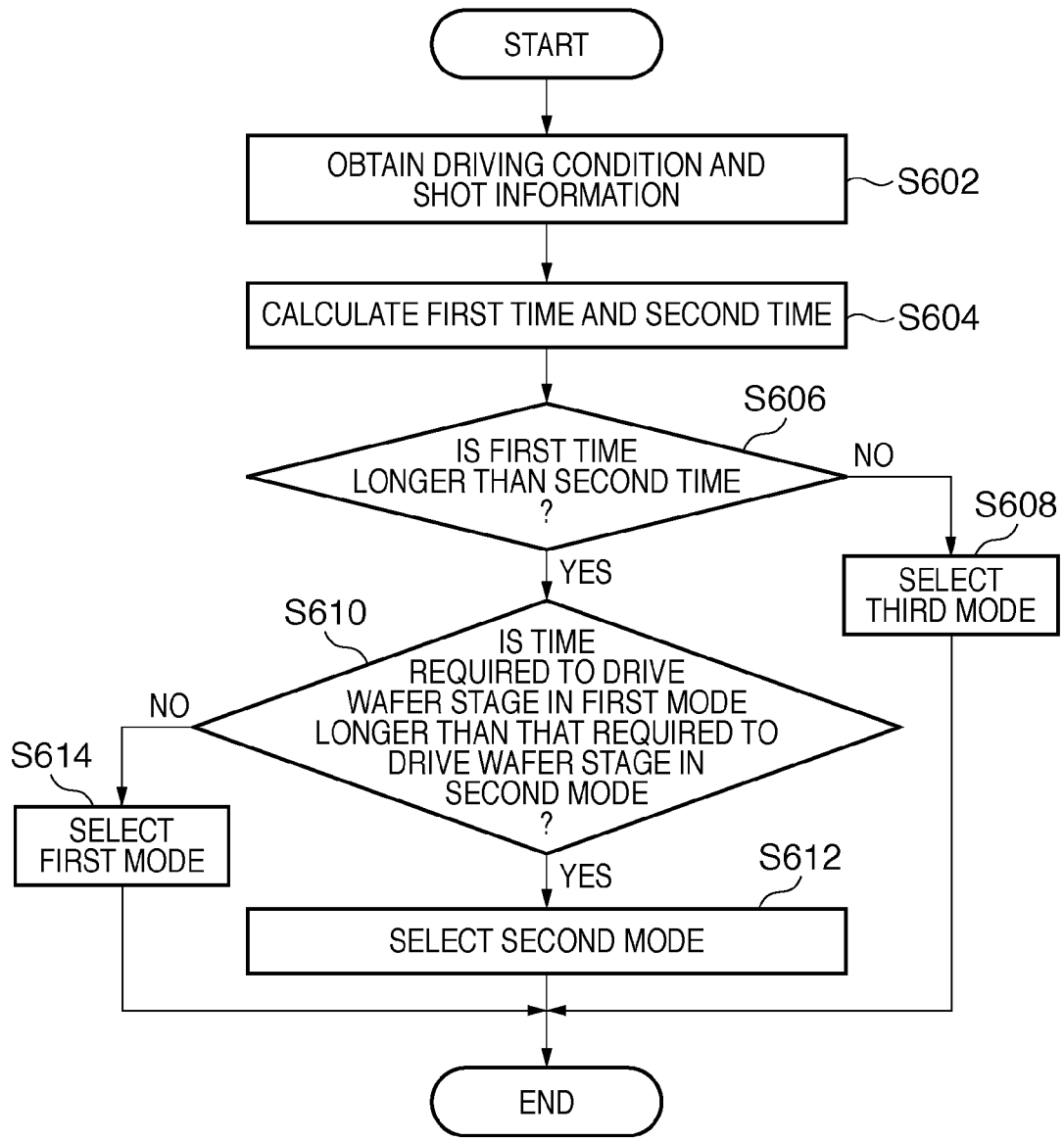
FIG. 6 is a flowchart for explaining a process for determining (selecting) a mode (driving mode) of driving the wafer stage from one of a plurality of shot regions to the next shot region in the first embodiment.

A process for determining (selecting) a mode (driving mode) of driving the wafer stage 135 from one of a plurality of shot regions to the next shot region will be explained with reference to FIG. 6. The main control unit 154 performs this process by systematically controlling each unit of the exposure apparatus 1, as described above.

In step S602, the main control unit 154 obtains the driving condition of the wafer stage 135 and shot information from the storage unit 155.

In step S604, the main control unit 154 calculates the above-mentioned first time and second time based on the driving condition and shot information obtained in step S602. As described above, the first time means the time required to drive the wafer stage 135 in the non-scanning direction perpendicular to the scanning direction from when exposure of one shot region ends until exposure of the next shot region starts. Also, the second time means the time required to drive the wafer stage 135 in the scanning direction from when exposure of one shot region ends until exposure of the next shot region starts.

In step S606, the main control unit 154 checks whether the first time calculated in step S604 is longer than the second time calculated in step S604.

If the main control unit 154 determines that the first time is not longer than the second time (i.e., the first time is shorter than the second time) (NO in step S606), the process advances to step S608. In step S608, the main control unit 154 selects the third mode as the mode of driving the wafer stage 135. As described above, the third mode means a mode of driving the wafer stage 135 without adjusting the time for which the acceleration of the wafer stage 135 changes in the process of reversing the scanning direction, and the settling time taken for the wafer stage 135 to settle after its driving. The third mode corresponds to the driving pattern shown in FIGS. 2A and 2B.

If the main control unit 154 determines that the first time is longer than the second time (YES in step S606), the process advances to step S610. In step S610, the main control unit 154 checks whether the time required to drive the wafer stage 135 in the first mode is longer than that required to drive the wafer stage 135 in the second mode.

If the main control unit 154 determines that the time required to drive the wafer stage 135 in the first mode is longer than that required to drive the wafer stage 135 in the second mode (YES in step S610), the process advances to step S612. In step S612, the main control unit 154 selects the second mode as the mode of driving the wafer stage 135. As described above, the second mode means a mode of driving the wafer stage 135 in the scanning direction by adjusting the settling time, taken for the wafer stage 135 to settle after its driving, so that the second time becomes longer than the first time. The second mode corresponds to the driving pattern shown in FIGS. 5A and 5B.

If the main control unit 154 determines that the time required to drive the wafer stage 135 in the first mode is not longer than that required to drive the wafer stage 135 in the second mode (NO in step S610), the process advances to step S614. In step S614, the main control unit 154 selects the first mode as the mode of driving the wafer stage 135. The first mode means a mode of driving the wafer stage 135 in the scanning direction by adjusting the time, for which the acceleration of the wafer stage 135 changes in the process of reversing the scanning direction, so that the second time becomes longer than the first time. The first mode corresponds to the driving pattern shown in FIGS. 4A and 4B.

In this manner, the exposure apparatus 1 according to the first embodiment can suppress a decrease in throughput by controlling stage driving in accordance with, for example, the stage driving condition and shot information concerning the arrangement of shot regions (by selecting a mode of driving the wafer stage 135).

In the second embodiment, a main control unit 154 calculates the first time and second time based on the driving condition and shot information obtained from a storage unit 155, as in the first embodiment. As described above, the first time means the time required to drive a wafer stage 135 in the non-scanning direction perpendicular to the scanning direction from when exposure of one shot region ends until exposure of the next shot region starts. Note, however, that in the second embodiment, the first time includes the settling time taken for vibration of the wafer stage 135 to fall within a tolerance. Also, the second time means the time required to drive the wafer stage 135 in the scanning direction from when exposure of one shot region ends until exposure of the next shot region starts. Note, however, that in the second embodiment, the second time includes the settling time after the end of exposure of one shot region, and the subsequent settling time before the start of exposure of the next shot region.

The main control unit 154 adjusts driving of the wafer stage 135 in the scanning direction (functions as an adjusting unit) when the calculated first time is longer than the calculated second time. More specifically, the main control unit 154 adjusts the time, for which the acceleration of the wafer stage 135 nonlinearly changes in the process of reversing the scanning direction, so that the second time becomes longer than the first time. Alternatively, the main control unit 154 adjusts the settling time, taken for the wafer stage 135 to settle from when its acceleration ends until exposure starts, so that the second time becomes longer than the first time. Note that a mode of driving the wafer stage 135 by adjusting the time for which the acceleration of the wafer stage 135 nonlinearly changes in the process of reversing the scanning direction is defined as a first mode. Note also that a mode of driving the wafer stage 135 by adjusting the settling time taken for the wafer stage 135 to settle from when its acceleration ends until exposure starts is defined as a second mode.

Then, the main control unit 154 selects the first or second mode in accordance with the mode of driving the wafer stage 135, which is set in advance by the user, when the calculated first time is longer than the calculated second time. Note that the main control unit 154 selects the third mode when the calculated first time is shorter than the calculated second time. The third mode means a mode of driving the wafer stage 135 without adjusting the time for which the acceleration of the wafer stage 135 nonlinearly changes in the process of reversing the scanning direction, and the settling time taken for the wafer stage 135 to settle from when its acceleration ends until exposure starts.

Control of an operation (process) for step-by-step movement from one shot region to the next shot region by the main control unit 154 in the second embodiment will be explained in detail.

Figures 7A, 7B:
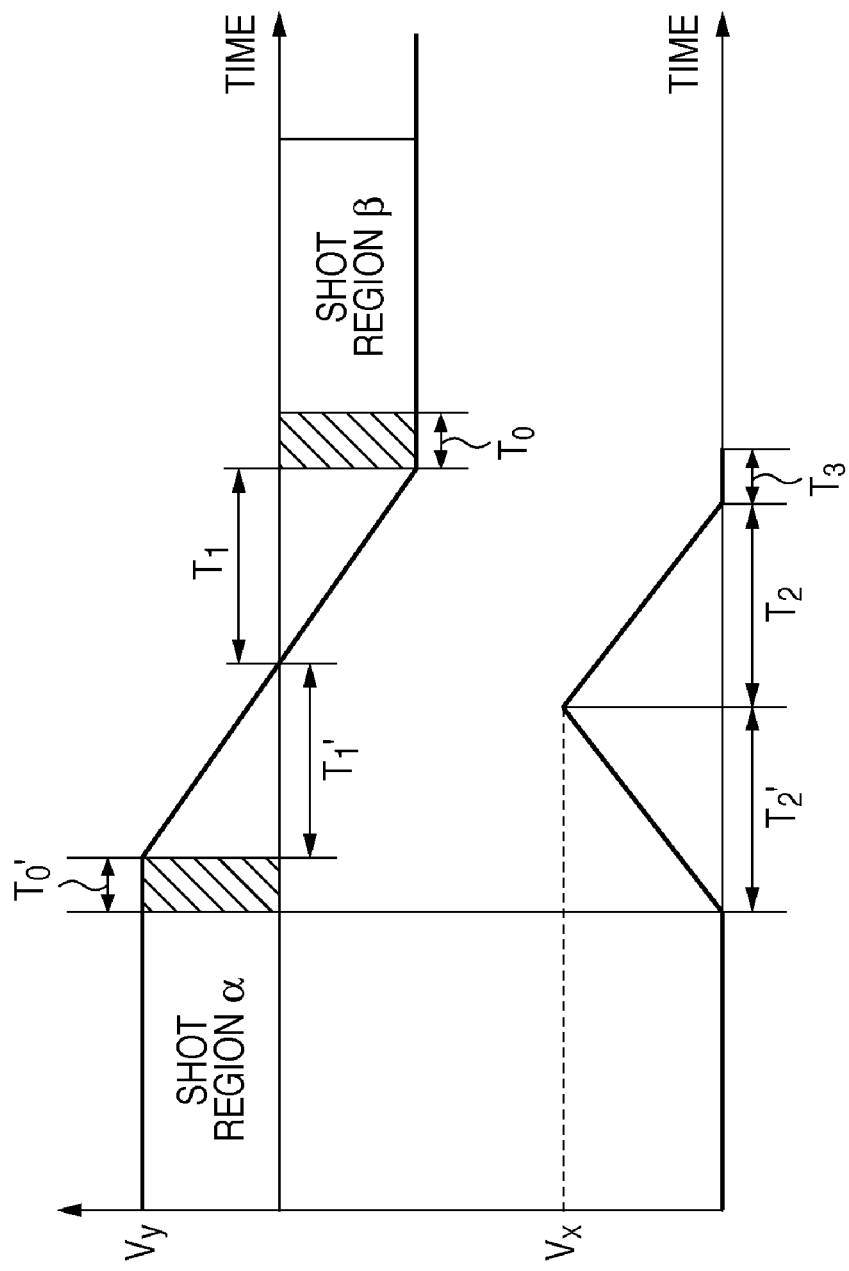
FIGS. 7A and 7B are graphs illustrating an example of a velocity control map of a wafer stage in step-by-step movement between two shot regions adjacent in the X direction in the second embodiment.

FIGS. 7A and 7B are graphs illustrating an example of a velocity control map of the wafer stage 135 in step-by-step movement between two shot regions (shot regions α and β) adjacent in the X direction. FIG. 7A represents a velocity (scanning velocity) $V_y$ of the wafer stage 135 in the scanning direction (Y direction), and FIG. 7B represents a velocity (scanning velocity) $V_x$ of the wafer stage 135 in the non-scanning direction (X direction). In both FIGS. 7A and 7B, the abscissa indicates time.

Referring to FIG. 7A, the total time to drive the wafer stage 135 in the scanning direction can be segmented into the above-mentioned four times (a) to (d).

Also, referring to FIG. 7B, the total time to drive the wafer stage 135 in the non-scanning direction can be segmented into three times:

(e) an acceleration time $T_2'$ for which the wafer stage 135 accelerates in the non-scanning direction in order for movement to the next shot region β after the end of exposure of the shot region α;

(f) a deceleration time $T_2$ for which the wafer stage 135 decelerates in the non-scanning direction; and (g) a settling time $T_3$ taken for the wafer stage 135 to settle after the end of its deceleration.

Driving of the wafer stage 135 in the non-scanning direction need only be completed before the completion of driving of the wafer stage 135 in the scanning direction for movement to the next shot region β after the end of exposure of the shot region α (before the end of a settling time $T_0$). In other words, the processing time corresponding to the above-mentioned times (a) to (g) need only satisfy (a)+(b)+(c)+(d)≧(e)+(f)+(g).

As in the first embodiment, let $L_x$ be the moving distance of the wafer stage 135 in the non-scanning direction, $V_x$ be the velocity of the wafer stage 135 in the non-scanning direction, and $T_2$ or $T_2'$ be the acceleration/deceleration time of the wafer stage 135 in the non-scanning direction. Also, let be the acceleration of the wafer stage 135 in the scanning direction, $L_y$ be the moving distance of the wafer stage 135 in the scanning direction (i.e., the scanning length), $T_1$ or $T_1'$ be the acceleration/deceleration time of the wafer stage 135 in the scanning direction, and $V_y$ be the velocity of the wafer stage 135 in the scanning direction. Then, we have:

$$L_x = V_x T_2$$

$$V_x = aT_2$$

$$L_y = V_y T_1$$

$$V_y = aT_1$$

Assume, for example, that the moving distance $L_x$ of the wafer stage 135 in the non-scanning direction is 20 mm, the acceleration a of the wafer stage 135 is 1 G, and the settling time $T_0$ and the subsequent settling time $T_0'$ are 10 ms.

Assume also that the velocity $V_y$ of the wafer stage 135 in the scanning direction is 450 mm/s, and the settling time $T_3$ is 5 ms.

In this case, $T_1=V_y/a=450/(1\times9.8)=45.9$ ms, and $T_2=\sqrt{L_x/a}=\sqrt{(0.02/(1\times9.8))}=45.2$ ms. Also, (a)+(b)+(c)+(d)=10 ms+45.9 ms+45.9 ms+10 ms=111.8 ms, and (e)+(f)+(g) =45.2 ms+45.2 ms+5 ms=95.4 ms. Hence, a relation (a)+(b)+ (c)+(d)$\geqq$(e)+(f)+(g) holds. This means that driving of the wafer stage 135 in the non-scanning direction can be completed before the completion of driving of the wafer stage 135 in the scanning direction for movement to the next shot region.

Figures 8A, 8B:
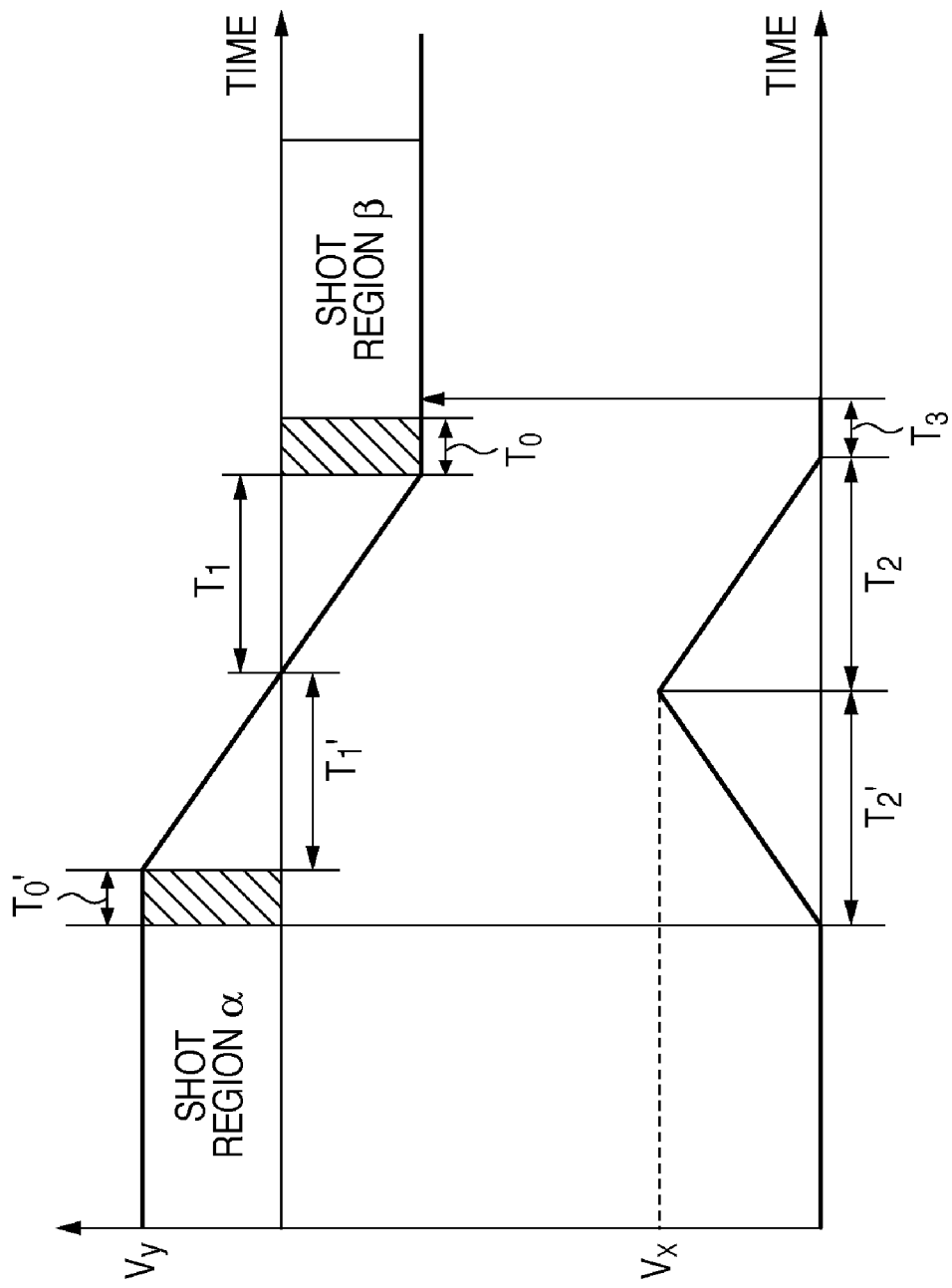
FIGS. 8A and 8B are graphs illustrating an example of a velocity control map of the wafer stage when the wafer stage moving distance (the distance between shot regions) in the non-scanning direction is increased in the second embodiment.

FIGS. 8A and 8B are graphs illustrating an example of a velocity control map of the wafer stage 135 when the moving distance of the wafer stage 135 in the non-scanning direction (the distance between shot regions) is increased. FIG. 8A represents a velocity (scanning velocity) $V_y$ of the wafer stage 135 in the scanning direction (Y direction), and FIG. 8B represents a velocity (scanning velocity) $V_x$ of the wafer stage 135 in the non-scanning direction (X direction). In both FIGS. 8A and 8B, the abscissa indicates time.

Assume, for example, that the moving distance $L_x$ of the wafer stage 135 in the non-scanning direction is 31 mm, the acceleration a of the wafer stage 135 is 1 G, and the settling time $T_0$ and the subsequent settling time $T_0'$ are 10 ms. Assume also that the velocity $V_y$ of the wafer stage 135 in the scanning direction is 450 mm/s, and the settling time $T_3$ taken for the wafer stage 135 to settle after the end of its deceleration in the non-scanning direction is 5 ms.

In this case, $T_1=V_y/a=450/(1\times9.8)=45.9$ ms, and $T_2=\sqrt{L_x/a}=\sqrt{(0.031/(1\times9.8))}=56.2$ ms. Also, (a)+(b)+(c)+(d)=10 ms+45.9 ms+45.9 ms+10 ms=111.8 ms, and (e)+(f)+(g) =56.2 ms+56.2 ms+5 ms=117.4 ms. Hence, a relation (a)+ (b)+(c)+(d)$\geqq$(e)+(f)+(g) does not hold. This means that driving of the wafer stage 135 in the non-scanning direction cannot be completed before the completion of driving of the wafer stage 135 in the scanning direction for movement to the next shot region.

To combat this problem, the time for which the acceleration of the wafer stage 135 nonlinearly changes in the process of reversing the scanning direction, or the settling time taken for the wafer stage 135 to settle from when its acceleration ends until exposure starts is adjusted, as will be described with reference to FIGS. 9A and 9B and 10A and 10B hereinafter, in the second embodiment. With this operation, driving of the wafer stage 135 in the non-scanning direction can be completed before the completion of driving of the wafer stage 135 in the scanning direction for movement to the next shot region.

Figures 9A, 9B:
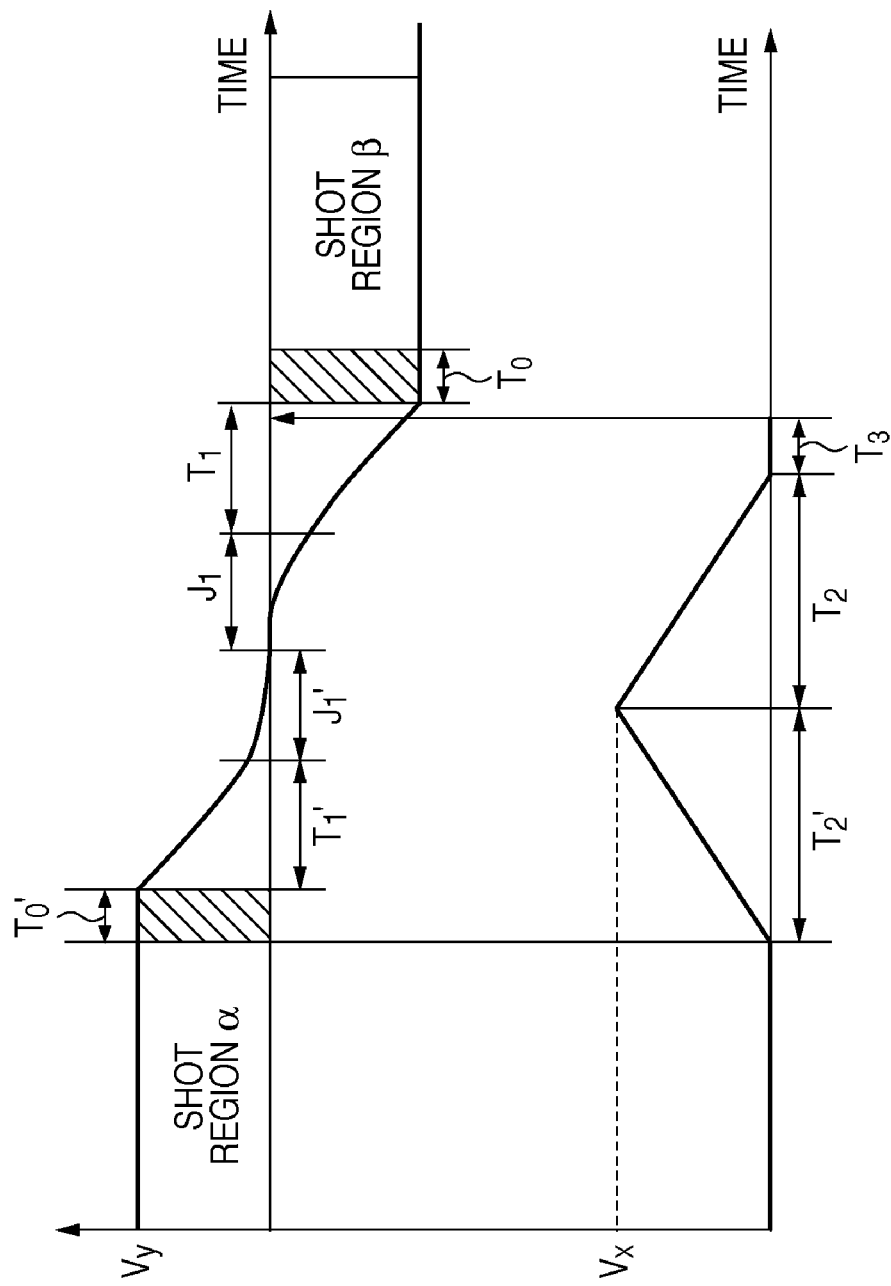
FIGS. 9A and 9B are graphs illustrating an example of a velocity control map of the wafer stage when the time for which the acceleration of the wafer stage nonlinearly changes in the process of reversing the scanning direction is adjusted in the second embodiment.

FIGS. 9A and 9B are graphs illustrating an example of a velocity control map of the wafer stage 135 when the time for which the acceleration of the wafer stage 135 changes in the process of reversing the scanning direction is adjusted. FIG. 9A represents a velocity (scanning velocity) $V_y$ of the wafer stage 135 in the scanning direction (Y direction), and FIG. 9B represents a velocity (scanning velocity) $V_x$ of the wafer stage 135 in the non-scanning direction (X direction). In both FIGS. 9A and 9B, the abscissa indicates time.

Assume, for example, that the moving distance $L_x$ of the wafer stage 135 in the non-scanning direction is 31 mm, the acceleration a of the wafer stage 135 is 1 G, and the settling time $T_0$ and the subsequent settling time $T_0'$ are 10 ms. Assume also that the velocity $V_y$ of the wafer stage 135 in the scanning direction is 450 mm/s, and the settling time $T_3$ taken for the wafer stage 135 to settle after the end of its deceleration in the non-scanning direction is 5 ms. Assume also that times $J_1$ and $J_1'$ for which the acceleration of the wafer stage 135 nonlinearly changes are 10 ms, and a difference $T_d$ in time, until the wafer stage 135 reaches a constant acceleration, between the presence/absence of the time for which the acceleration of the wafer stage 135 nonlinearly changes is 3.75 ms.

In this case, $T_1=V_y/a-T_d=450/(1\times9.8)-3.75=42.2$ ms, and $T_2=\sqrt{L_x/a}=\sqrt{(0.031/(1\times9.8))}=56.2$ ms. Also, (a)+(b)+(c)+(d) =10 ms+42.2 ms+10 ms+10 ms+42.2 ms+10 ms=124.4 ms, and (e)+(f)+(g)=56.2 ms+56.2 ms+5 ms=117.4 ms. Hence, a relation (a)+(b)+(c)+(d)$\geqq$(e)+(f)+(g) holds. This means that driving of the wafer stage 135 in the non-scanning direction can be completed before the completion of driving of the wafer stage 135 in the scanning direction for movement to the next shot region.

Figures 10A, 10B:
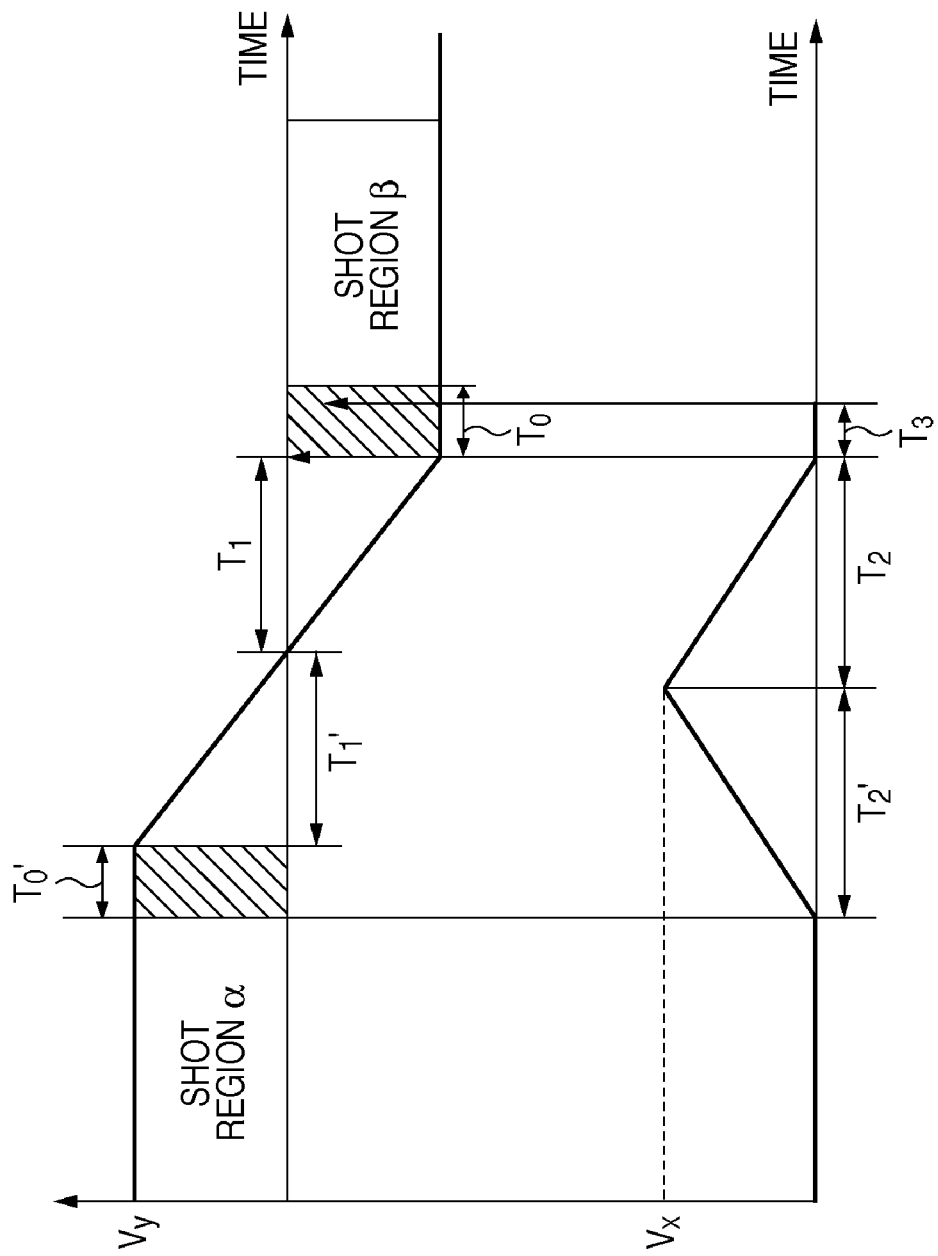
FIGS. 10A and 10B are graphs illustrating an example of a velocity control map of the wafer stage when the settling time taken for the wafer stage to settle from when its acceleration ends until exposure starts is adjusted in the second embodiment.

FIGS. 10A and 10B are graphs illustrating an example of a velocity control map of the wafer stage 135 when the settling time taken for the wafer stage 135 to settle from when its acceleration ends until exposure starts is adjusted. FIG. 10A represents a velocity (scanning velocity) $V_y$ of the wafer stage 135 in the scanning direction (Y direction), and FIG. 10B represents a velocity (scanning velocity) $V_x$ of the wafer stage 135 in the non-scanning direction (X direction). In both FIGS. 10A and 10B, the abscissa indicates time.

A relation (a)+(b)+(c)+(d)$\geqq$(e)+(f)+(g) does not hold when the moving distance $L_x$ of the wafer stage 135 in the non-scanning direction remains 31 mm, and the settling time $T_0$ and the subsequent settling time $T_0'$ remain 10 ms, as described above. However, a relation (a)+(b)+(c)+(d)$\geqq$(e)+ (f)+(g) holds upon adjusting the settling time $T_0$ and the subsequent settling time $T_0'$ to 12.8 ms by an increment of 5.6 ms/2=2.8 ms. With this operation, driving of the wafer stage 135 in the non-scanning direction can be completed before the completion of driving of the wafer stage 135 in the scanning direction for movement to the next shot region, as shown in FIGS. 10A and 10B.

Figure 11:
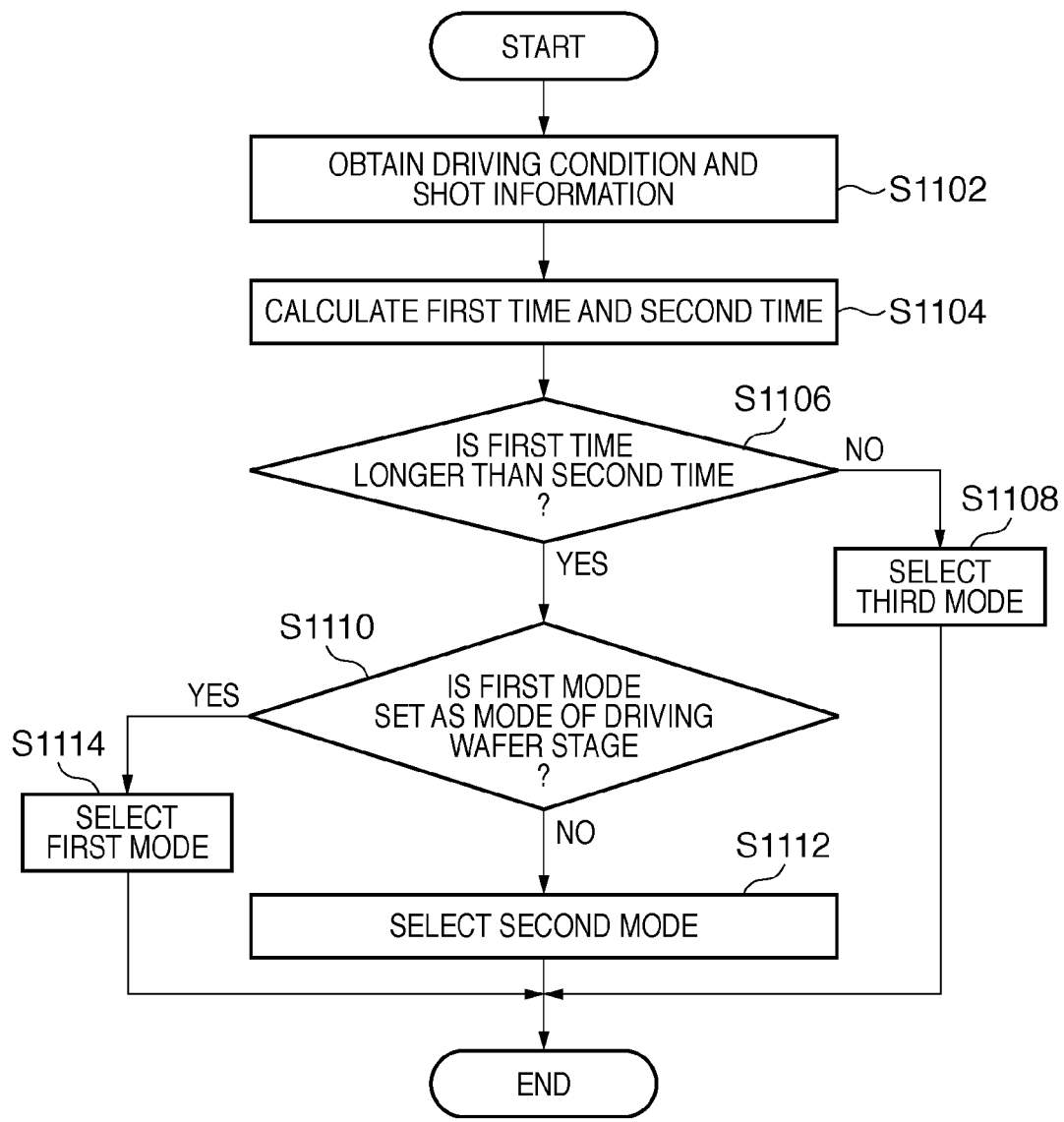
FIG. 11 is a flowchart for explaining a process for determining (selecting) a mode (driving mode) of driving the wafer stage from one of a plurality of shot regions to the next shot region in the second embodiment.

A process for determining (selecting) a mode (driving mode) of driving the wafer stage 135 from one of a plurality of shot regions to the next shot region will be explained with reference to FIG. 11. The main control unit 154 performs this process by systematically controlling each unit of the exposure apparatus 1.

In step S1102, the main control unit 154 obtains the driving condition of the wafer stage 135 and shot information from the storage unit 155.

In step S1104, the main control unit 154 calculates the first time and second time based on the driving condition and shot information obtained in step S1102. As described above, the first time means the time required to drive the wafer stage 135 in the non-scanning direction perpendicular to the scanning direction from when exposure of one shot region ends until exposure of the next shot region starts. Also, the second time means the time required to drive the wafer stage 135 in the scanning direction from when exposure of one shot region ends until exposure of the next shot region starts.

In step S1106, the main control unit 154 checks whether the first time calculated in step S604 is longer than the second time calculated in step S604.

If the main control unit 154 determines that the first time is not longer than the second time (i.e., the first time is shorter than the second time) (NO in step S1106), the process advances to step S1108. In step S1108, the main control unit 154 selects the third mode as the mode of driving the wafer stage 135. The third mode means a mode of driving the wafer stage 135 without adjusting the time for which the acceleration of the wafer stage 135 nonlinearly changes in the process of reversing the scanning direction, and the settling time taken for the wafer stage 135 to settle after its driving. The third mode corresponds to the driving pattern shown in FIGS. 7A and 7B.

If the main control unit 154 determines that the first time is longer than the second time (YES in step S1106), the process advances to step S1110. In step S1110, the main control unit 154 checks whether the mode of driving the wafer stage 135, which is set in advance by the user, is the first mode.

If the first mode is not set as the mode of driving the wafer stage 135 (i.e., if the second mode is set) (NO in step S1110), the process advances to step S1112. In step S1112, the main control unit 154 selects the second mode as the mode of driving the wafer stage 135. The second mode means a mode of driving the wafer stage 135 in the scanning direction by adjusting the settling time, taken for the wafer stage 135 to settle from when its acceleration ends until exposure starts, so that the second time becomes longer than the first time. The second mode corresponds to the driving pattern shown in FIGS. 10A and 10B.

If the first mode is set as the mode of driving the wafer stage 135 (YES in step S1110), the process advances to step S1114. In step S1114, the main control unit 154 selects the first mode as the mode of driving the wafer stage 135. The first mode means a mode of driving the wafer stage 135 in the scanning direction by adjusting the time, for which the acceleration of the wafer stage 135 nonlinearly changes in the process of reversing the scanning direction, so that the second time becomes longer than the first time. The first mode corresponds to the driving pattern shown in FIGS. 9A and 9B.

In this manner, the exposure apparatus 1 according to the second embodiment can suppress a decrease in throughput by controlling stage driving in accordance with, for example, the stage driving condition and shot information concerning the arrangement of shot regions (by selecting a mode of driving the wafer stage 135).

The exposure apparatus 1 according to each of the first and second embodiments can provide devices (e.g., a semiconductor device, an LCD device, an image sensing device (e.g., a CCD), and a thin-film magnetic head) with a high throughput and good economical efficiency. The devices are manufactured by a step of exposing a substrate (e.g., a wafer or a glass plate) coated with a photoresist (photosensitive agent) using the exposure apparatus 1, a step of developing the exposed substrate, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2008-229066 filed on Sep. 5, 2008 and 2009-143669 filed on Jun. 16, 2009, which are hereby incorporated by reference herein in their entirety.

What is claimed is:

1. A scanning exposure apparatus which sequentially transfers a pattern of a reticle to a plurality of shot regions on a substrate while synchronously moving the reticle and the substrate in a scanning direction and reversing the scanning direction, the apparatus comprising:
   an obtaining unit configured to obtain a driving condition of a stage which holds the substrate, and shot information concerning an arrangement of the plurality of shot regions;
   a calculating unit configured to calculate, based on the driving condition and shot information obtained by the obtaining unit, a first time serving as a time required to drive the stage in a non-scanning direction perpendicular to the scanning direction, and a second time serving as a time required to drive the stage in the scanning direction, both of which range from when exposure of one of the plurality of shot regions ends until exposure of the next shot region starts; and
   an adjusting unit configured to adjust, when the first time calculated by the calculating unit is longer than the second time calculated by the calculating unit, one of a time for which an acceleration of the stage nonlinearly changes in the process of reversing the scanning direction, and a settling time taken for the stage to settle from when acceleration of the stage ends until exposure starts, so that the second time becomes longer than the first time in driving the stage in the scanning direction.

2. The apparatus according to claim 1, wherein the driving condition includes at least one of a velocity, acceleration, and jerk of the stage.

3. The apparatus according to claim 1, wherein the shot information includes a distance between adjacent shot regions of the plurality of shot regions, and lengths of the plurality of shot regions in a longitudinal direction.

4. The apparatus according to claim 1, wherein when the first time calculated by the calculating unit is shorter than the second time calculated by the calculating unit, the adjusting unit does not adjust the time for which an acceleration of the stage nonlinearly changes in the process of reversing the scanning direction, and the settling time taken for the stage to settle from when acceleration of the stage ends until exposure starts.

5. A device fabrication method comprising:
   exposing a substrate using an exposure apparatus,
   wherein the exposure apparatus is a scanning exposure apparatus which sequentially transfers a pattern of a reticle to a plurality of shot regions on the substrate while synchronously moving the reticle and the substrate in a scanning direction and reversing the scanning direction, the exposure apparatus comprising:
   an obtaining unit configured to obtain a driving condition of a stage which holds the substrate, and shot information concerning an arrangement of the plurality of shot regions,
   a calculating unit configured to calculate, based on the driving condition and shot information obtained by the obtaining unit, a first time serving as a time required to drive the stage in a non-scanning direction perpendicular to the scanning direction, and a second time serving as a time required to drive the stage in the scanning direction, both of which range from when exposure of one of the plurality of shot regions ends until exposure of the next shot region starts, and
   an adjusting unit configured to adjust, when the first time calculated by the calculating unit is longer than the second time calculated by the calculating unit, one of a time for which an acceleration of the stage nonlinearly changes in the process of reversing the scanning direction, and a settling time taken for the stage to settle from when acceleration of the stage ends until exposure starts, so that the second time becomes longer than the first time in driving the stage in the scanning direction; and
   performing a development process for the substrate exposed.

6. A scanning exposure apparatus which sequentially transfers a pattern of a reticle to a plurality of shot regions on a substrate while synchronously moving the recticle and the substrate in a scanning direction and reversing the scanning direction, the apparatus comprising:

an obtaining unit configured to obtain a driving condition of a stage which holds the substrate, and shot information concerning an arrangement of the plurality of shot regions;

a calculating unit configured to calculate, based on the driving condition and shot information obtained by the obtaining unit, a first time serving as a time required to drive the stage in a non-scanning direction perpendicular to the scanning direction, and a second time serving as a time required to drive the stage in the scanning direction, both of which range from when exposure of one of the plurality of shot regions ends until exposure of the next shot region starts; and an adjusting unit configured to adjust, when the first time calculated by the calculating unit is longer than the second time calculated by the calculating unit, a time for which an acceleration of the stage nonlinearly changes in the process of reversing the scanning direction so that the second time becomes longer than the first time in driving the stage in the scanning direction.

7. A scanning exposure apparatus which sequentially transfers a pattern of a reticle to a plurality of shot regions on a substrate while synchronously moving the recticle and the substrate in a scanning direction and reversing the scanning direction, the apparatus comprising:

an obtaining unit configured to obtain a driving condition of a stage which holds the substrate, and shot information concerning an arrangement of the plurality of shot regions;

a calculating unit configured to calculate, based on the driving condition and shot information obtained by the obtaining unit, a first time serving as a time required to drive the stage in a non-scanning direction perpendicular to the scanning direction, and a second time serving as a time required to drive the stage in the scanning direction, both of which range from when exposure of one of the plurality of shot regions ends until exposure of the next shot region starts; and an adjusting unit configured to adjust, when the first time calculated by the calculating unit is longer than the second time calculated by the calculating unit, a settling time taken for the stage to settle from when acceleration of the stage ends until exposure starts so that the second time becomes longer than the first time in driving the stage in the scanning direction.

* * * * *